United States Patent
Savoj et al.

(10) Patent No.: US 8,736,325 B1
(45) Date of Patent: May 27, 2014

(54) WIDE FREQUENCY RANGE CLOCK GENERATION USING A SINGLE OSCILLATOR

(71) Applicant: Xilinx, Inc., San Jose, CA (US)

(72) Inventors: Jafar Savoj, Sunnyvale, CA (US); Kun-Yung Chang, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/629,377

(22) Filed: Sep. 27, 2012

(51) Int. Cl.
*H03L 7/06* (2006.01)
(52) U.S. Cl.
USPC ............... 327/156; 327/147; 327/150
(58) Field of Classification Search
USPC .......................... 327/147, 150, 156
See application file for complete search history.

(56) References Cited

U.S. PATENT DOCUMENTS

2013/0076415 A1* 3/2013 Hara et al. ............... 327/159

OTHER PUBLICATIONS

Razavi, Behzad, "Multi-Decade Carrier Generation for Cognitive Radios", 2009 Symposium on VLSI Circuits Digest of Technical Papers, 2009, pp. 120-121.

* cited by examiner

*Primary Examiner* — John Poos
(74) *Attorney, Agent, or Firm* — Gerald Chan

(57) ABSTRACT

A system for wide frequency range clock generation, includes: a phase lock loop (PLL) to generate a signal having a frequency; at least one fractional-N divider to divide the frequency of the signal; and a multiplexer to receive the signal from the PLL and an output signal from the at least one fractional-N divider, and to select the signal from the PLL or the output signal from the at least one fractional-N divider as a selected signal.

16 Claims, 3 Drawing Sheets

WIDE FREQUENCY RANGE CLOCK GENERATION USING A SINGLE OSCILLATOR

FIELD

An embodiment described herein relates to wide frequency range clock generation. In particular, it relates to wide frequency range clock generation using a single oscillator.

BACKGROUND

Field programmable gate arrays (FPGAs) may be designed to support a variety of high-speed serial standards with speeds ranging from several hundreds of megahertz (MHz) to several decades of gigahertz (GHz). Such requirements mandate the use of a frequency synthesizer phase lock loop (PLL) whose output frequency can range over multiple decades of gigahertz. Current transceivers resolve this issue by using multiple parallel voltage controlled oscillators (VCOs), each of which produces the required output frequency over a different fraction of the desired frequency spectrum. However, this solution requires a large area of silicon due to the need for multiple inductor-capacitor voltage controlled oscillators (LC VCOs), which have large inductor coils. One or more embodiments described below address these issues.

SUMMARY

In accordance with some embodiments, a system for wide frequency range clock generation, includes: a phase lock loop (PLL) configured to generate a signal having a frequency; at least one fractional-N divider where a first one of the at least one fractional-N divider is coupled to the PLL, and the at least one fractional-N divider is configured to divide the frequency of the signal; and a multiplexer coupled to the PLL and the at least one fractional-N divider, where the multiplexer is configured to receive the signal from the PLL and an output signal from the at least one fractional-N divider, and to select the signal from the PLL or the output signal from the at least one fractional-N divider as a selected signal.

In accordance with other embodiments, a method for wide frequency range clock generation, includes: generating a signal having a frequency; dividing the frequency of the signal with at least one fractional-N divider to generate a plurality of frequency divided signals; and selecting the generated signal or a particular one of the plurality of frequency divided signals to obtain a selected signal.

Other and further aspects and features will be evident from reading the following detailed description of the embodiments.

DESCRIPTION OF THE FIGURES

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of the scope of the claims.

DETAILED DESCRIPTION

Figure 1:
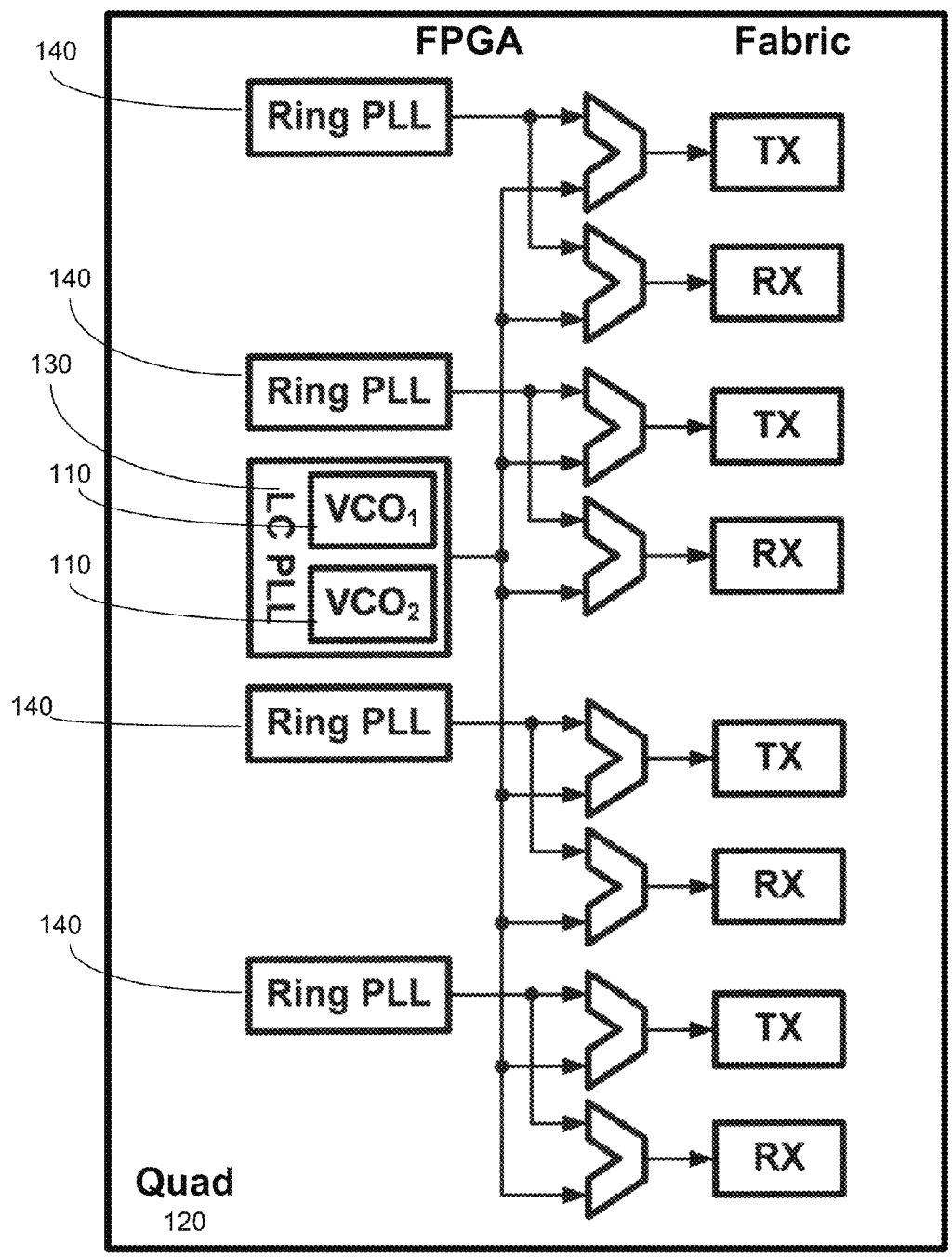
FIG. 1 is an illustration of a system used for wide frequency range clock generation using multiple parallel oscillators, in accordance with at least one embodiment.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or explicitly described.

One or more embodiments disclosed herein provide an operative system for wide frequency range clock generation. At least one embodiment resolves the issues described earlier by utilizing a single inductor-capacitor voltage controlled oscillator (LC VCO) with a moderate tuning range combined with an array of fractional-N dividers (FN DIVs). Proper choice of the number (n) of fractional-N dividers and their fractional divide ratios ($1/\alpha$) results a continuous frequency range.

In particular, the disclosed system employs an inductor-capacitor voltage-controlled oscillator (LC VCO) along with an array of fractional N-dividers. Since this system design requires the use of only a single LC VCO, the system design requires a smaller area of silicon than conventional systems for wide frequency range clock generation because the conventional systems employ multiple inductor-capacitor voltage controlled oscillators (LC VCOs), which have large inductor coils. In some embodiments, the LC VCO is able to achieve low jitter and superior signal quality. It should be noted that for the disclosed system design, the single LC VCO and the array of fractional-N dividers are integrated into, for example, a quad transceiver of an integrated circuit such as, for example, a field programmable gate array (FPGA).

A FPGA transceiver is designed to cover a wide range of data rates across different channels. Ring-based phase lock loops (PLLs) provide a wide tuning range, but fail to produce a low-jitter clock signal with moderate power consumption for protocols with stringent jitter generation and tolerance specifications. Inductor-capacitor (LC)-based PLLs, on the other hand, offer lower jitter and power consumption, but typically fail to produce a tuning range beyond twenty percent (20%).

FIG. 1 is an illustration of a system 100 used for wide frequency range clock generation using multiple parallel oscillators 110, in accordance with at least one embodiment.

In this figure, to support a wide frequency range and flexible clocking at lower rates, a quad transceiver 120 utilizes a shared inductor-capacitor phase lock loop (LC PLL) 130 per quad 120 with two or more LC VCOs 110, and a ring-PLL 140 per channel. Given the limited tuning range for LC oscillators 110, as the maximum speed of operation for the transceiver 120 increases, the total number of required LC oscillators 110 required to cover the frequency range increases as well. This results in utilizing increased silicon area, complications with clock routing, and requiring additional power overhead. One or more embodiments resolve the need for using multiple LC oscillators 110, as is shown in FIG. 1, by utilizing a design having a single oscillator 410 (refer to FIG. 4) along with a chain of fractional-N dividers 430 (refer to FIG. 4).

Figure 2:
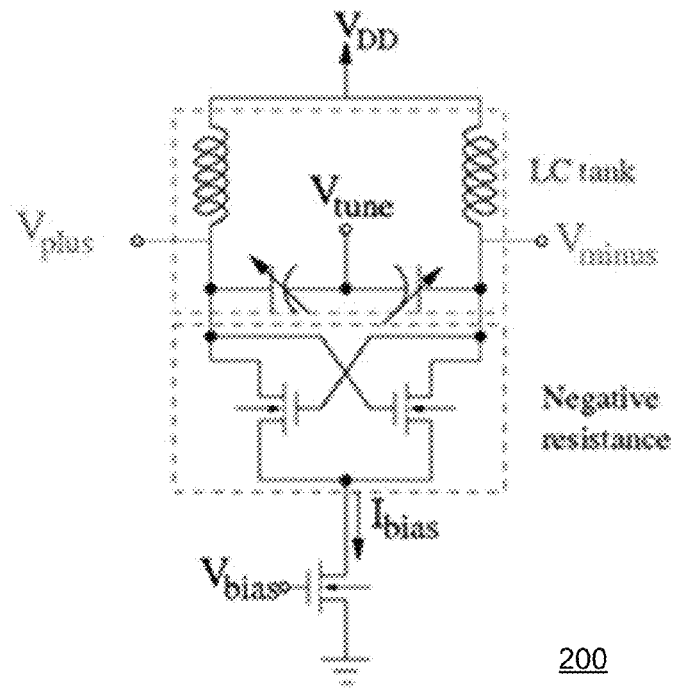
FIG. 2 is an illustration of a circuit diagram of an exemplary inductor-capacitor voltage controlled oscillator (LC VCO), in accordance with at least one embodiment.

FIG. 2 is an illustration of a circuit diagram 200 of an exemplary inductor-capacitor voltage controlled oscillator (LC VCO), in accordance with at least one embodiment. Inductor-capacitor voltage controlled oscillators (LC VCOs) includes two main stages. These stages are the gain stage and the inductor-capacitor (LC) tank. LC VCOs are a type of resonant oscillator, and can be designed for a fixed frequency or a variable frequency operation, which requires the use of a varactor (i.e. a back-biased diode). LC VCOs have very good phase noise and jitter performance at high frequencies.

Figure 3:
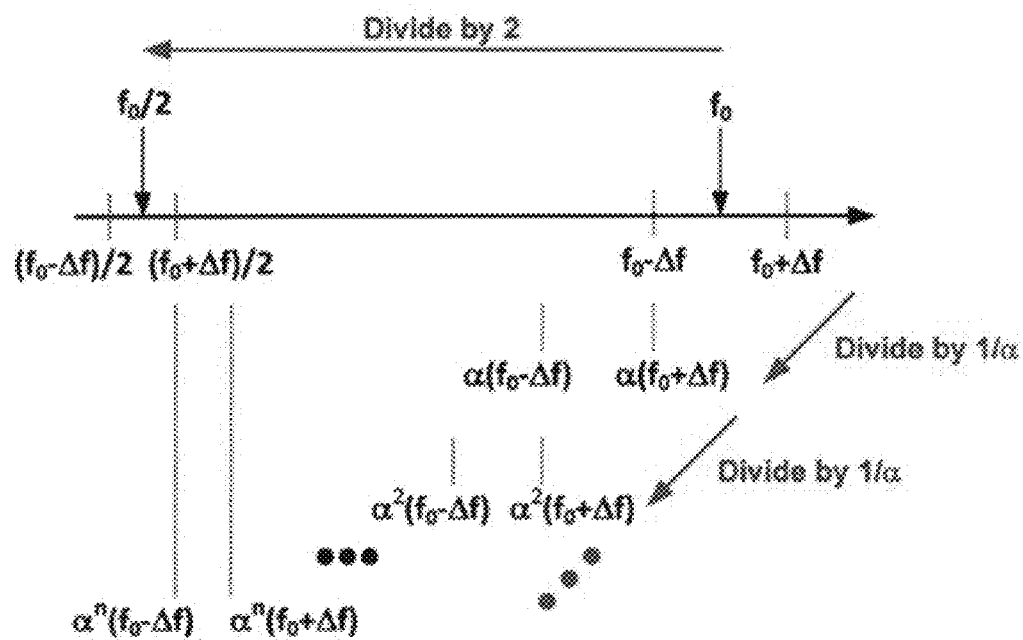
FIG. 3 is an illustration of a frequency plan approach to be utilized by the disclosed system for wide frequency range clock generation utilizing a single oscillator of FIG. 4, in accordance with at least one embodiment.

FIG. 3 shows an embodiment in which the entire frequency range required for the quad transceiver is covered by multiplying the frequency range of the original oscillator in a fractional number by using a cascade of n number fractional-N dividers, which has the effect of dividing the frequency range.

An example of how the number n of dividers can be determined using the design parameters presented in FIG. 3 for the frequency tuning range of a single LC oscillator is presented below.

The main oscillator center frequency is equal to: $f_0$
The main oscillator frequency range is equal to: $\{f_0-\Delta f, f_0+\Delta f\}$
The next lower frequency range is equal to: $\{\alpha(f_0-\Delta f), \alpha(f_0+\Delta f)\}$
The boundary condition for the continuous frequency range is equal to:

$$f_0-\Delta f = \alpha(f_0+\Delta f) \rightarrow \alpha = (f_0-\Delta f)/(f_0+\Delta f)$$

If the same multiplication factor of a (i.e. the same divide ratio of $1/\alpha$) is applied to the proceeding stages, in order to maintain the boundary condition for a continuous frequency range, then: $\alpha^{m-1}(f_0-\Delta f) = \alpha^m(f_0+\Delta f)$. This is guaranteed to happen with any choice of $\alpha$.

At the same time, this clocking structure needs to cover the frequency range between $\{f_0/2, f_0\}$ since the rest of the frequency range can be covered by dividing the above frequency range by 2, 4, 8, . . .

The final boundary condition is solved for in order to determine the relationship between $\alpha$ and n.

$$\alpha^n(f_0-\Delta f) = (f_0+\Delta f)/2 \rightarrow \alpha = \frac{1}{2}^{1/(n+1)}$$

$(n+1)\log \alpha = \log(\frac{1}{2}) = -\log 2$ $n+1 = -\log 2/\log \alpha$ $n = (-\log 2/\log \alpha) - 1$ Where this value is rounded up so that n is an integer.

An example of how a can be chosen with respect to the percentage frequency range of the LC oscillator is presented below.

The percentage frequency range of the LC oscillator is equal to: $\Delta f/f_0$

Then, $\alpha$ is solved for with respect to the percentage frequency range by using the above-mentioned equation for a:

$\alpha = (f_0-\Delta f)/(f_0+\Delta f)$ $\alpha = \{f_0(1-\Delta f/f_0)\}/\{f_0(1+\Delta f/f_0)\}$ $\alpha = (1-\Delta f/f_0)/(1+\Delta f/f_0)$ This resulting equation can be used to chose a for a given percentage frequency range of the LC oscillator.

For example, for the case where the LC oscillator achieves a percentage frequency range of plus or minus fifteen percent (15%), $\alpha$ will solve for 0.74 ($\alpha=(1-\Delta f/f_0)/(1+\Delta f/f_0)=(1-0.15)/(1+0.15)=0.74$). And n will solve for 1.3 ($n=(-\log 2/\log \alpha)-1=(-\log 2/\log 0.74)-1=1.3$). In order to provide design margin, $\alpha$ is chosen to be 0.8 and n is chosen to be 2. Since n is chosen to be 2, two (2) divide by 0.8 dividers will be employed in the system design.

These chosen design parameters will result in:
a frequency range of $\{0.85 f, 1.15 f\}$ for the main oscillator $1-\Delta f/f_0 = 1-0.15 = 0.85$ $1+\Delta f/f_0 = 1+0.15 = 1.15$ a frequency range of $\{0.68 f, 0.92 f\}$ after the first divider $\alpha(1-\Delta f/f_0) = 0.8(1-0.15) = 0.68$ $\alpha(1+\Delta f/f_0) = 0.8(1+0.15) = 0.92$ a frequency range of $\{0.544 f, 0.74 f\}$ after the second divider $\alpha^2(1-\Delta f/f_0) = 0.8^2(1-0.15) = 0.544$ $\alpha^2(1+\Delta f/f_0) = 0.8^2(1+0.15) = 0.74$ Further, dividing the frequency of the main oscillator by two (2) covers the frequency range of $\{0.425 f, 0.575 f\}$ (i.e. 0.85/2=0.425 and 1.15/2=0.575). This guarantees that the entire frequency range from 0.5 f to f can be covered using this approach with a margin. Lower frequencies can be covered by dividing this range by 2, 4, 8, etc.

Figure 4:
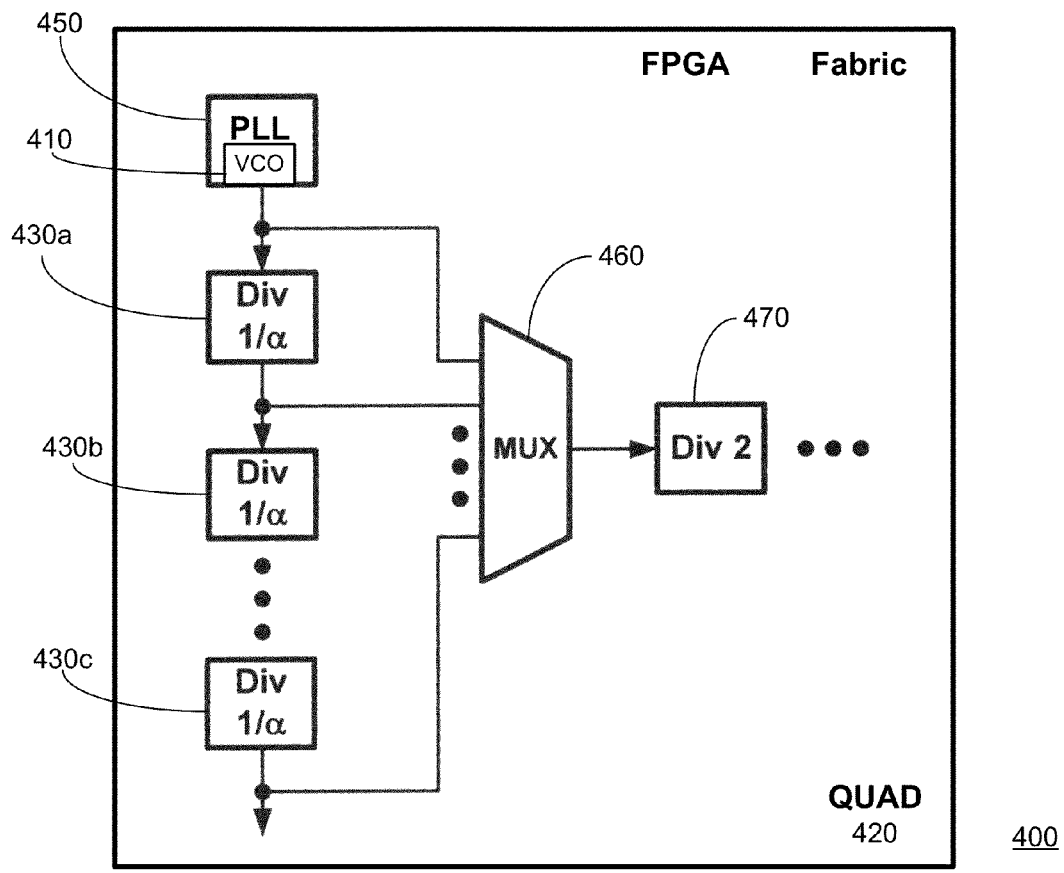
FIG. 4 is an illustration of the disclosed system for wide frequency range clock generation utilizing a single oscillator, in accordance with at least one embodiment.

FIG. 4 is an illustration of the disclosed system 400 for wide frequency range clock generation utilizing a single oscillator 410, in accordance with at least one embodiment. In this figure, a phase lock loop (PLL) 450, multiple fractional-N dividers 430, a multiplexer 460, and a divide-by-two divider 470 are shown to be implemented into a quad transceiver 420 of an integrated circuit such as, e.g., a field programmable gate array (FPGA).

Also in this figure, the phase lock loop (PLL) 450 is shown to be connected in series with the multiple fractional-N dividers 430. The PLL 450 contains a single voltage controlled oscillator (VCO) 410. In one or more embodiments, the VCO 410 is an inductor-capacitor voltage controlled oscillator (LC VCO). Each fractional-N divider 430 multiplies the signal it receives at its input by $1/\alpha$ (i.e. divides the signal it receives by a).

In addition, in this figure, the output of the PLL 450 and the outputs of the fractional N dividers 430 are each connected to the input of the multiplexer 460. In addition, the output of the multiplexer is connected to the input of the divide-by-two divider 470. It should be noted that in some embodiments, more than one divide-by-two divider 470 will be employed by the disclosed system 400. When more than one divide-by-two (divider 470 is employed by the disclosed system 400, the divide-by-two dividers 470 are connected with one another in series.

In order to better understand the system 400 depicted in FIG. 4, a brief description of the method of operation of the system 400 is presented. At the beginning of the method, the PLL 450 generates a signal having a frequency. The signal is outputted from the output of the PLL 450 and is inputted into the input of a first fractional-N divider 430a and inputted into the input of the multiplexer 460. The first fractional-N divider 430a divides the signal it receives at its input by α. The first fractional-N divider 430a then outputs from its output the resultant signal. The signal outputted from the output of the first fractional-N divider 430a is inputted into the input of the multiplexer 460 as well as inputted into the input of a second fractional-N divider 430b.

After the second fractional-N divider 430b receives the signal from the output of the first fractional-N divider 430a, the second fractional-N divider 430b divides the signal it receives at its input by α. Then, the second fractional-N divider 430b outputs from its output the resultant signal. The signal outputted from the output of the second fractional-N divider 430b is inputted into the input of the multiplexer 460 and inputted into the input of a third fractional-N divider 430c.

After the third fractional-N divider 430c receives the signal from the output of the second fractional-N divider 430b, the third fractional-N divider 430c divides the signal it receives at its input by α. Then, the third fractional-N divider outputs from its output the resultant signal. The signal outputted from the output of the third fractional-N divider 430c is inputted into the input of the multiplexer 460. It should be noted that in this example, the number n of fractional-N dividers 430 is three (3). However, in other embodiments, the disclosed system may employ more than or less than three fractional-N dividers 430.

After all of the signals are inputted into the input of the multiplexer 460, the multiplexer 460 selects the signal outputted directly from the PLL 450 or one of the signals outputted from one of the fractional-N dividers 430 that it received at its input. Once the multiplexer 460 selects a signal, the multiplexer 460 outputs that signal at its output, and inputs that signal into a divide-by-two divider 470. The divide-by-two divider 470 then divides the signal it receives at its input by two. Then, the divide-by-two divider 470 outputs at its output a resultant signal. In this example, only one divide-by-two divider 470 is employed. However, in other embodiments, the disclosed system may employ more than or less than one divide-by-two dividers 470.

Figure 5:
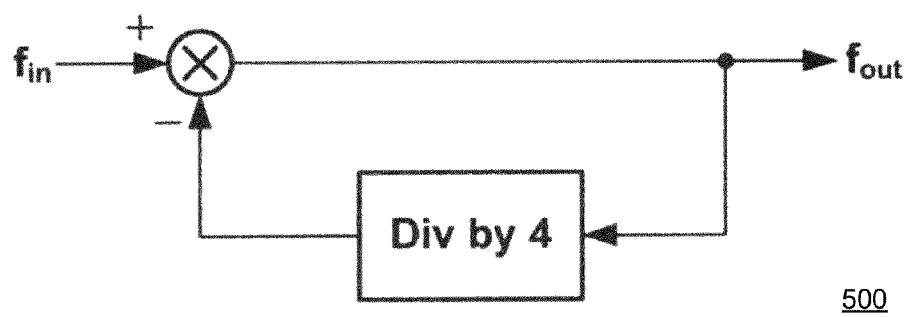
FIG. 5 is an illustration of a divide by five-fourths (5/4) divider that may be employed by the disclosed system for wide frequency range clock generation utilizing a single oscillator of FIG. 4, in accordance with at least one embodiment.

FIG. 5 is an illustration of a divide-by-five-fourths (5/4) divider 500 that may be employed by the disclosed system 400 for wide frequency range clock generation utilizing a single oscillator 410 of FIG. 4, in accordance with at least one embodiment. In this figure, an output signal ($f_{out}$) is formed by subtracting from an input signal ($f_{in}$) the quantity of $f_{out}/4$. The resultant signal is shown to be the output signal ($f_{out}$).

In one or more embodiments, any type of VCO with a limited tuning range may be employed.

Also, in one or more embodiments, the PLL 450, the fractional-N divider(s) 430, the multiplexer 460, and/or the divide-by-two divider(s) 470 may be utilized by any system requiring a very wide frequency range.

The equations for deriving a for the five-fourths (5/4) divider of FIG. 5 are presented below.

$$f_{out} = f_{in} - (f_{out}/4)$$

$$f_{in} = (5/4)f_{out}$$

$$f_{out} = (4/5)f_{in}$$

$$f_{in} = f_{out}/\alpha \rightarrow f_{out} = \alpha f_{in}$$

$$\alpha = 4/5 = 0.8$$

Although particular embodiments have been shown and described, it will be understood that they are not intended to limit the claimed inventions, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

The invention claimed is:

1. A system for wide frequency range clock generation, comprising:
    a phase lock loop (PLL) configured to generate a signal having a frequency;
    at least one fractional-N divider, wherein a first one of the at least one fractional-N divider is coupled to the PLL, and the at least one fractional-N divider is configured to divide the frequency of the signal; and
    a multiplexer, coupled to the PLL and the at least one fractional-N divider, configured to receive the signal from the PLL and an output signal from the at least one fractional-N divider, and to select the signal from the PLL or the output signal from the at least one fractional-N divider as a selected signal;
    wherein the at least one fractional-N divider comprises a divide-by-1/α divider; and
    wherein α is equal to $(f_0-\Delta f)/(f_0+\Delta f)$, $f_0$ is equal to the frequency of the signal, and $\Delta f$ is equal to one-half of an operating frequency range of an oscillator of the phase lock loop.

2. A system for wide frequency range clock generation, comprising:
    a phase lock loop (PLL) configured to generate a signal having a frequency;
    at least one fractional-N divider, wherein a first one of the at least one fractional-N divider is coupled to the PLL, and the at least one fractional-N divider is configured to divide the frequency of the signal;
    a multiplexer, coupled to the PLL and the at least one fractional-N divider, configured to receive the signal from the PLL and an output signal from the at least one fractional-N divider, and to select the signal from the PLL or the output signal from the at least one fractional-N divider as a selected signal; and
    at least one divide-by-two divider to divide a frequency of the selected signal from the multiplexer.

3. The system of claim 2, wherein an output of the multiplexer is connected to an input of the at least one divide-by-two divider.

4. The system of claim 2, wherein at least one of the PLL, the at least one fractional-N divider, the multiplexer, and the at least one divide-by-two divider is contained on a single field programmable gate array (FPGA).

5. The system of claim 1, wherein an output of the PLL and an output of the at least one fractional-N divider are connected to an input of the multiplexer.

6. The system of claim 1, wherein the PLL includes only one voltage controlled oscillator (VCO).

7. The system of claim 6, wherein the VCO is an inductor-capacitor voltage controlled oscillator (LC VCO).

8. The system of claim 1, wherein the at least one fractional-N divider comprises multiple fractional-N dividers, and a number n of the fractional-N dividers is equal to (−log 2/log α)−1 rounded up to a next integer.

9. A method for wide frequency range clock generation, comprising:
  generating a signal having a frequency;
  dividing, using at least one fractional-N divider, the frequency of the signal to generate a plurality of divided frequency signals; and
  selecting the generated signal or a particular one of the plurality of frequency divided signals to obtain a selected signal;
  wherein the at least one fractional-N divider comprises a divide-by-$1/\alpha$ divider and
  wherein $\alpha$ is equal to $(f_0-\Delta f)/(f_0+\Delta f)$, $f_0$ is equal to the frequency of the signal, and $\Delta f$ is equal to one-half of an operating frequency range of an oscillator of the phase lock loop.

10. The method of claim 9, further comprising dividing, with at least one divide-by-two divider, a frequency of the selected signal.

11. The method of claim 10, further comprising outputting the selected signal through an output of the multiplexer to an input of the at least one divide-by-two divider.

12. The method of claim 10, wherein at least one of: (a) a PLL that generates the signal having the frequency, (b) the at least one fractional-N divider, (c) a multiplexer that selects the generated signal or a particular one of the plurality of frequency divided signals, and (d) the at least one divide-by-two divider is implemented using a single field programmable gate array (FPGA); and
  wherein the acts of generating the signal, dividing the frequency of the signal, selecting, and dividing the frequency of the selected signal, are performed by the FPGA.

13. The method of claim 12, wherein the PLL and the at least one fractional-N divider are connected to an input of the multiplexer.

14. The method of claim 12, wherein the PLL comprises only one voltage controlled oscillator (VCO), and the signal is generated using the VCO.

15. The method of claim 14, wherein the VCO is an inductor-capacitor voltage controlled oscillator (LC VCO).

16. The method of claim 9, wherein the at least one fractional-N divider comprises multiple fractional-N dividers, and a number n of the fractional-N dividers is equal to $(-\log 2/\log \alpha)-1$ rounded up to a next integer.

* * * * *